United States Patent

Tawarayama

[11] Patent Number: 5,917,381
[45] Date of Patent: Jun. 29, 1999

[54] AMPLIFIER

[75] Inventor: Hideki Tawarayama, Kyoto, Japan

[73] Assignee: Rohm Co., Ltd, Kyoto, Japan

[21] Appl. No.: 09/028,485

[22] Filed: Feb. 24, 1998

[30] Foreign Application Priority Data

Mar. 14, 1997 [JP] Japan .................................. 9-061050

[51] Int. Cl.⁶ .................................................. H03F 3/04
[52] U.S. Cl. ........................................... 330/288; 330/257
[58] Field of Search .................................... 330/288, 257, 330/252, 9; 323/315, 316

[56] References Cited

U.S. PATENT DOCUMENTS

| | | | |
|---|---|---|---|
| 4,492,824 | 1/1985 | Bell et al. ................................. | 179/81 |
| 4,786,855 | 11/1988 | O'Neill et al. ........................... | 323/314 |
| 5,276,405 | 1/1994 | Mazzucco et al. ....................... | 330/257 |
| 5,570,008 | 10/1996 | Goetz ....................................... | 323/315 |

*Primary Examiner*—Robert Pascal
*Assistant Examiner*—Henry Choe
*Attorney, Agent, or Firm*—Nikaido, Marmelstein, Murray & Oram LLP

[57] ABSTRACT

In an amplifier, a first transistor of npn type has its base connected to an input terminal, a second transistor of pnp type has its base connected to the base of the first transistor, and a third transistor of pnp type has its base connected to the base of the first transistor. A current mirror circuit doubles the collector current of the second transistor so that the doubled current is used as the emitter current of the third transistor. The base currents of the first and second transistors are supplied by the base current of the third transistor.

3 Claims, 2 Drawing Sheets

AMPLIFIER

BACKGROUND OF THE INVENTION

1. Field of the Invention

The present invention relates to an amplifier composed mostly of transistors.

2. Description of the Prior Art

FIG. 3 shows an example of a conventional differential amplifier. This amplifier has a pair of transistors T1 and T2 whose emitters are both connected to a constant current source 35 and whose bases are respectively connected to a first and a second input terminal 31 and 32. The collectors of the transistors T1 and T2 are respectively connected to transistors T3 and T4 that form a current mirror circuit, and the output from these transistors T3 and T4 is delivered through a transistor T5 to an output terminal 33. Numeral 34 represents a power line for the supply of a direct-current voltage Vcc, and numeral 36 represents a constant current source that is connected to the emitter of the transistor T5. Thus, an input signal applied between the input terminals 31 and 32 is amplified and then delivered to the output terminal.

Inconveniently, however, this amplifier cannot be kept in operation unless the base currents of the transistors T1 and T2 are kept supplied via the input terminals 31 and 32. Moreover, as the constant current I is increased, the base currents supplied need to be increased accordingly. Furthermore, in this amplifier, if there is an error between the base currents supplied via the first and second input terminals 31 and 32, it causes an undesirable offset voltage to appear at the output.

SUMMARY OF THE INVENTION

An object of the present invention is to provide an amplifier that requires substantially no supply of base currents from the outside and that produces as small an offset voltage as possible at the output.

To achieve the above object, according to the present invention, an amplifier having a first transistor of a first conduction type whose base is connected to an input terminal is further provided with a second transistor of the first conduction type whose base is connected to the base of the first transistor; a third transistor of a second conduction type whose base is connected to the base of the first transistor; and means for doubling the collector current of the second transistor so that the doubled current is used as the emitter current of the third transistor, and, in this amplifier, the base currents of the first and second transistors are supplied by the base current of the third transistor.

In this amplifier, the third transistor is of the conduction type opposite to the first and second transistors, and therefore the base current of the third transistor is divided into two equal portions when it flows into the bases of the first and second transistors. In other words, the base current of the first transistor for amplification is supplied from the third transistor. As a result, this amplifier can be kept in operation without the supply of base currents from the outside. In addition, this amplifier has a high input impedance.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
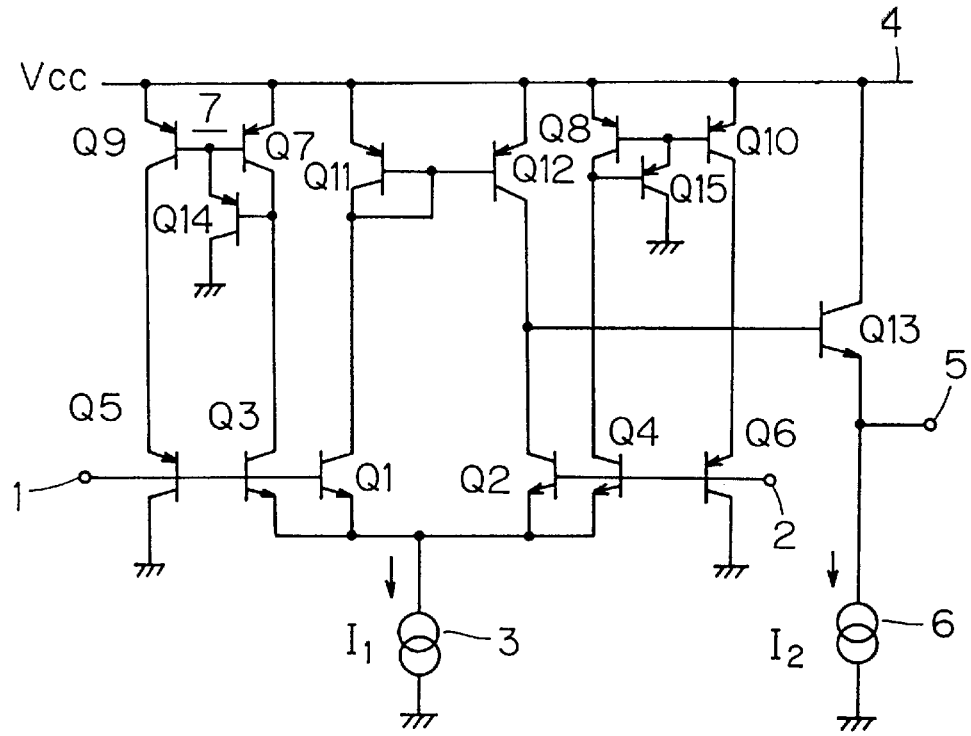
FIG. 1 is a circuit diagram of an amplifier embodying the invention.

FIG. 1 shows an example of an amplifier embodying the invention. In this amplifier, npn-type transistors Q1 and Q2 have their emitters connected to a constant current source 3, and have their bases connected respectively to a first and second input terminal 1 and 2. The collector of the transistor Q1 is connected to the collector and base of a pnp-type transistor Q11 that serves as the input-side transistor of a current mirror circuit, and the collector of the transistor Q2 is connected to the collector of a pnp-type transistor Q12 that serves as the output-side transistor of the same current mirror circuit. The emitters of the transistors Q11 and Q12 are connected to a power line 4 that supplies a direct-current voltage Vcc.

The collectors of the transistors Q2 and Q12 are connected to the base of an npn-type transistor Q13. The transistor Q13 is for buffering, and has its collector connected to the power line 4 and its emitter connected to an output terminal 5 and a constant current source 6. The constant current source 6 produces a current $I_2$.

The transistors Q1 and Q2 receive their base currents from circuits provided at their respective bases. Q3 is an npn-type transistor that has its base connected to the input terminal 1. Q5 is a pnp-type transistor that has its base connected to the input terminal 1 and its collector connected to ground (a reference potential point).

The emitter of the transistor Q3 is connected to the constant current source 3, and its collector is connected to the collector of a pnp-type transistor Q7 that serves as the input-side transistor of a current mirror circuit 7. The current mirror circuit 7 consists of, in addition to the transistor Q7, a pnp-type transistor Q9 with so large an area ratio as to have twice the current capacity of the transistor Q7, and a pnp-type transistor Q14 that connects between the base and collector of the transistor Q7. The emitters of the transistors Q7 and Q9 are connected to the power line 4, the collector of the transistor Q14 is connected to ground, and the other ends of the constant current sources 3 and 6 are connected to ground.

The emitter of the transistor Q5 is connected to the collector of the transistor Q9. The transistor Q5 is so formed as to have a current capacity sufficient to accept the output current of the transistor Q9.

Let the collector current and the base current of the npn-type transistor Q1 be $I_{CQ1}$ and $I_{BQ1}$. Then, these currents $I_{CQ1}$ and $I_{BQ1}$ are respectively equal to the collector current $I_{CQ3}$ and the base current $I_{BQ3}$ of the transistor Q3. Hence, the base current at the input terminal 1 equals $2I_{BQ1}$, which, if the current amplification ratio of these transistors is assumed to be $\beta$, is expressed as $$2I_{BQ1} = 2I_{CQ1}/\beta \qquad (1)$$

The collector current $I_{CQ3}$ of the transistor Q3 induces a current $2I_{CQ1}$ to flow into the emitter of the transistor Q5. As a result, if the current amplification ratio of the transistor Q5 is assumed to be β', the base current of the transistor Q5 is expressed as $$-2I_{CQ1}/\beta' \qquad (2)$$

Hence, the base current at the input terminal 1 is calculated, by adding up expressions (1) and (2), as $$2I_{CQ1}/\beta - 2I_{CQ1}/\beta' \qquad (3)$$

Here, if it is assumed that the current amplification ratio β of the npn-type transistors and the current amplification ratio β' of the pnp-type transistor are very close to each other, expression (3) substantially equals to zero. This means that no current flows at the input terminal 1 (that is, the input impedance is high). Accordingly, it is no longer necessary to supply currents from the outside, regardless of the amount of the constant current $I_1$ produced by the constant current source 3.

Neither does an error in the base currents cause an offset voltage at the output. Note that a base-current-supplying circuit identical with the one just described is provided also at the base of the transistor Q2, that is, for the input terminal 2, with the transistors Q4, Q6, Q8, Q10, and Q15 corresponding to the already mentioned transistors Q3, Q5, Q7, Q9, and Q14, respectively.

Figure 2:
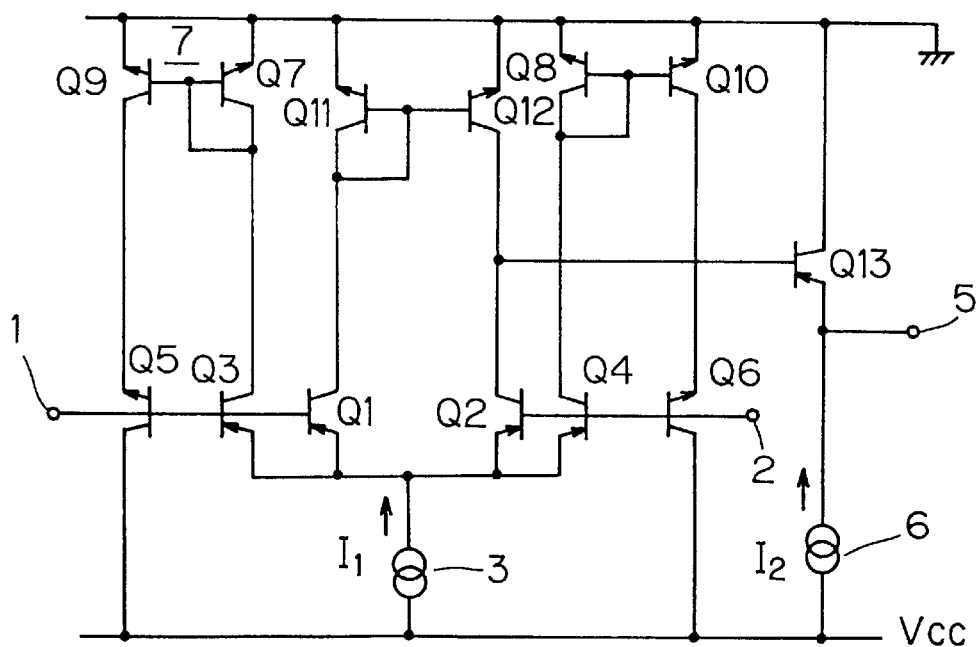
FIG. 2 is a circuit diagram of another amplifier embodying the invention.
Figure 3:
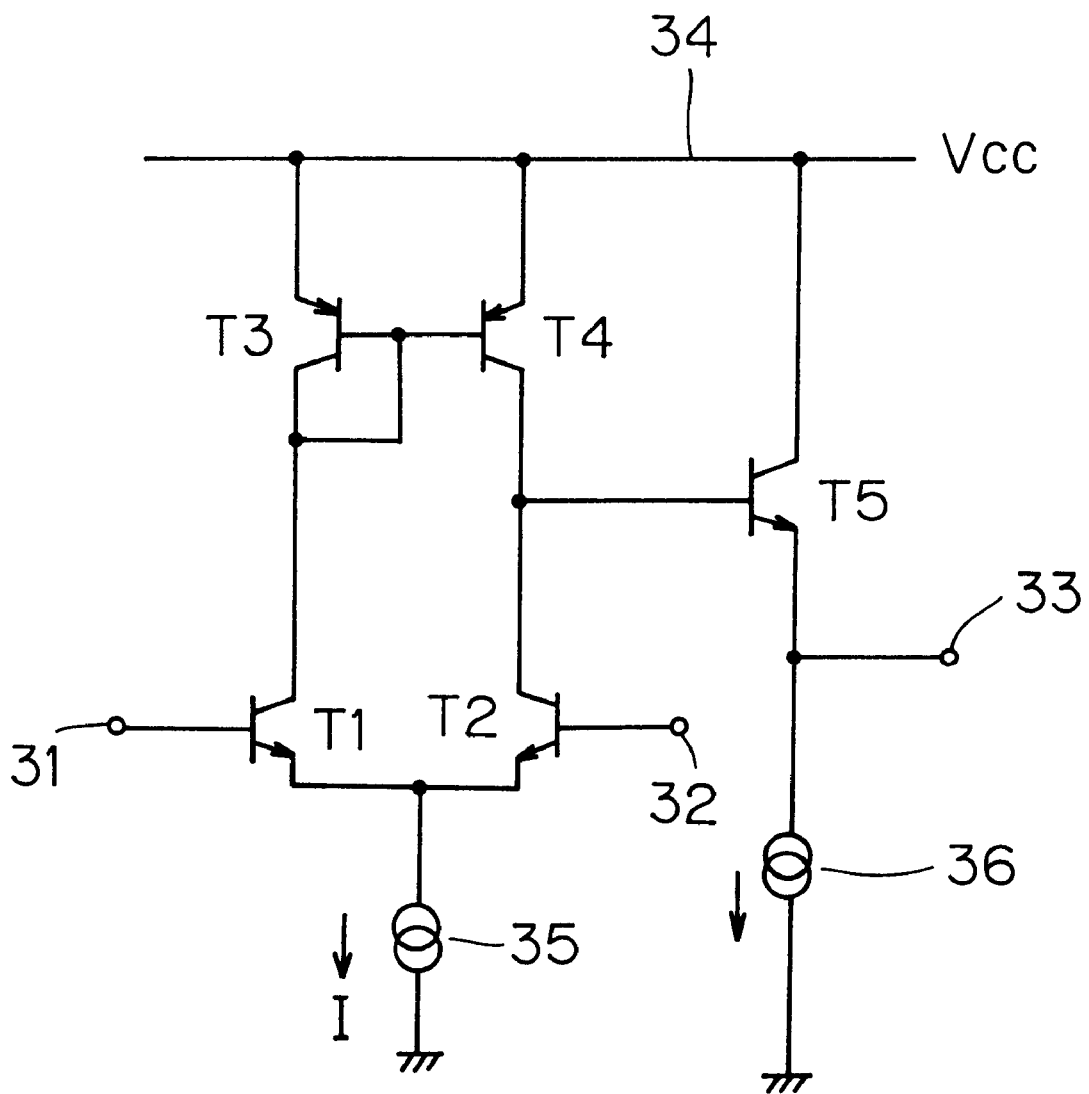
FIG. 3 is a circuit diagram of a conventional amplifier.

FIG. 2 shows another example of an amplifier embodying the invention. In this amplifier, as compared with the one shown in FIG. 1, transistors of the opposite conduction types are used and the transistors Q14 and Q15 are omitted. This amplifier offers just the same advantages as the previously described one. Although the amplifiers shown in FIGS. 1 and 2 are both formed as differential amplifiers, the present invention is applicable also to amplifiers other than differential amplifiers.

As described above, according to the present invention, it is possible to realize an amplifier that requires substantially no supply of base currents from the outside, that provides a high input impedance, and that produces only a negligibly small offset voltage at the output.

What is claimed is:

1. An amplifier having a first transistor of a first conduction type whose base is connected to an input terminal, further comprising:

a second transistor of the first conduction type whose base is connected to a base of the first transistor;

a third transistor of a second conduction type whose base is connected to the base of the first transistor; and means for doubling a collector current of the second transistor so that the doubled current is used as an emitter current of the third transistor, wherein base currents of the first and second transistors are supplied by a base current of the third transistor.

2. An amplifier as claimed in claim 1, wherein said means is a current mirror circuit, the current mirror circuit having, on its input side, a transistor of the second conduction type that has its base and collector connected to a collector of the second transistor and has its emitter connected to a power line, the current mirror circuit having, on its output side, a transistor of the second conduction type that has its collector connected to an emitter of the third transistor, has its base connected to the base of the transistor on the input side of the current mirror circuit, and has its emitter connected to the power line.

3. An amplifier as claimed in claim 1, further comprising:

a fourth transistor of the first conduction type whose emitter is connected, together with an emitter of the first transistor, to a constant current source common to the first and fourth transistors and whose base is connected to a second input terminal, and fifth and sixth transistors that are connected to the fourth transistor in the same manner as the second and third transistors are connected to the first transistor, wherein the amplifier is formed as a differential amplifier.

\* \* \* \* \*